United States Patent [19]

Rajivan

[11] Patent Number: 5,532,625
[45] Date of Patent: Jul. 2, 1996

[54] WAVE PROPAGATION LOGIC

[75] Inventor: Sathyanandan Rajivan, San Jose, Calif.

[73] Assignee: Sun Microsystems, Inc., Mountain View, Calif.

[21] Appl. No.: 397,419

[22] Filed: Mar. 1, 1995

[51] Int. Cl.⁶ .............................................. H03K 19/017
[52] U.S. Cl. .................. 326/98; 326/34; 326/93
[58] Field of Search .................. 326/31, 93, 98, 326/34

[56] References Cited

U.S. PATENT DOCUMENTS

| | | | |
|---|---|---|---|
| 4,570,084 | 2/1986 | Griffin et al. | 326/98 |
| 4,780,626 | 10/1988 | Guerin et al. | 326/98 |
| 4,827,160 | 5/1989 | Okano | 326/31 |
| 4,831,285 | 5/1989 | Gaiser | 326/93 X |
| 4,899,066 | 2/1990 | Aikawa et al. | 326/98 |
| 4,985,643 | 1/1991 | Proebsting | 307/443 |
| 5,089,726 | 2/1992 | Chappell et al. | 307/530 |
| 5,208,490 | 5/1993 | Yetter | 326/98 |
| 5,333,119 | 7/1994 | Raatz et al. | 364/760 |

OTHER PUBLICATIONS

Hwang et al, "Ultrafast Compact 32–bit CMOS Adders in Multiple-Output Domino Logic", *IEEE JSSC*, vol. 24, No. 2, Apr. 1989.

R. H. Krambeck et al., High–Speed Compact Circuits with CMOS, Jun. 1982, IEEE Journal of Solid–State Circuits, vol. SC-17, No. 3.

*Primary Examiner*—David R. Hudspeth
*Attorney, Agent, or Firm*—Hickman Beyer & Weaver

[57] ABSTRACT

A wave propagation circuit having one or more circuit stages. Each circuit stage preferably has the same number of evaluation devices as the number of logic inputs into that circuit stage. The circuit stages alternately precharge and evaluate in a serial, wavelike manner responsive to a clock signal. During the precharge cycle of the clock, a precharge pulse propagates from circuit stage to circuit stage to precharge the output nodes of the circuit stages in a distributed, serial manner. During the evaluation cycle of the clock, a pulsed data signal permits the first stage to evaluate its inputs. Responsive to the output of the first circuit stage, a second circuit stage evaluates its inputs. The circuit further includes forward conduction devices and feedback devices to improve the noise margin and to reduce output errors caused by charge sharing and charge redistribution. Optional power saving circuits precharge an output terminal of a circuit stage during a precharge phase only if that output terminal switches during a previous evaluation phase.

23 Claims, 14 Drawing Sheets

5,532,625

WAVE PROPAGATION LOGIC

BACKGROUND OF THE INVENTION

The present invention relates to apparatus and methods for an improved CMOS circuit. More particularly, the present invention relates to a new type of CMOS circuit that advantageously reduces the capacitive loading on a common clock, the instantaneous peak current, as well as power consumption, and offers greater speed and performance.

CMOS technology has long been employed to reduce power dissipation. The low impedance gate output to Vss via the n-channel device and the similar low impedance gate output to Vdd via the p-channel device has made CMOS the technology of choice for lower power dissipation in high speed products. However, the complementary nature of CMOS circuits requires a p-channel device and an n-channel device, or two devices, for each input gate. In the aggregate, the high number of devices required to build a CMOS circuit necessitates a large silicon area, increases the capacitive loading on gates, and adversely affects the overall operational speed and performance of the circuit.

A type of clocked logic circuits, commonly known as domino logic, offers speed and area advantages over static CMOS technology while retaining the desirable low power dissipation feature. See, e.g., R. H. Krambeck, et al., "High-Speed Compact Circuits with CMOS," IEEE Journal of Solid State Circuits (June 1982) SC-17(3):614–619. Domino logic gates use either p-channel devices or n-channel devices for evaluating and realizing a Boolean function. Compared to CMOS circuits, domino logic reduces the number of devices required to implement a particular function by approximately half. Concomitantly, capacitive loading and circuit size are significantly reduced.

FIG. 1 shows a typical prior art domino logic stage. Referring to FIG. 1, a single domino logic circuit stage 2 includes a dynamic section comprising devices 10, 12, 14, 16 and 18, and a static inverting buffer 20. P-channel precharge device 10 and n-channel discharge device 18 are clocked by a CLK signal 22. A plurality of input signals A-C on conductors 24, 26, and 28 are respectively coupled to n-channel devices 12, 14, and 16 to form an evaluation tree comprising a pull-down network for realizing an arbitrary combinational function. Since the evaluation tree is comprised of n-channel devices, the domino logic circuit of FIG. 1 is said to be n-channel based.

For consistency and ease of understanding, n-channel based logic is arbitrarily chosen for discussion herein. It should be understood, however, that the discussion is equally applicable to p-channel based devices, and that the apparatus and methods of the invention described herein can be readily adapted for use with p-channel based devices by those of ordinary skills in the art given this disclosure.

When CLK signal 22 goes low, the precharge phase begins. P-channel precharge device 10 is turned on, connecting output terminal 23 to Vdd. N-channel discharge device 18 is turned off, disconnecting the circuit from Vss. Output terminal 23 is pulled high, causing node 25 to go low via inverting buffer 20.

The evaluation phase occurs upon the low-high transition of CLK signal 22. When CLK signal 22 goes high, p-channel precharge device 10 is turned off, removing Vdd from the circuit. Further, n-channel device 18 is turned on by the high CLK signal 22.

During the evaluation phase, output terminal 23 either stays high or is pulled toward Vss depending on the state of the signals on conductors 24, 26, and 28. In the example of FIG. 1, if signals A-C on conductors 24, 26, and 28 are all high, a discharge path between output terminal 23 and Vss exists, causing output terminal 23 to pull low. When output terminal 23 goes low, node 25 goes high via inverting buffer 20. On the other hand, if any one of signals A-C on conductors 24, 26, or 28 is low, output terminal 23 remains disconnected from Vss and stays high, causing node 25 to stay low. As is evident from the foregoing, domino logic gate 2 of FIG. 1 implements a NAND-3 gate.

To implement more complex functions using domino logic, multiple single domino circuit stages, such as that shown in FIG. 1, are cascaded. Referring to FIG. 2, domino logic stage 2 of FIG. 1 is reproduced on the left hand side. Node 25 of domino stage 2 is used as an input to an n-channel evaluation device 30 of a subsequent domino stage 32. Domino stage 32 also has an input D on conductor 42 coupled to another n-channel device 34. During precharge, node 23 of stage 2 is pulled high by p-channel precharge device 10 as discussed earlier. Further, output terminal 36 of domino stage 32 is also pulled high by p-channel precharge device 38 when CLK signal 22 goes low. N-channel discharge devices 18 and 40 are turned off, disconnecting domino stages 2 and 32 respectively from Vss.

During evaluation, the high CLK signal 22 shuts off both p-channel precharge devices 10 and 38 and turns on both n-channel discharge devices 18 and 40. If input signal D on conductor 42 is high, n-channel device 34 conducts, causing output terminal 36 to go low and node 44 to pull high via an inverter 46. If all of inputs A, B, and C on conductors 24, 26, and 28 of domino stage 2 are high, node 25 of domino stage 2 goes high during evaluation as discussed in connection with FIG. 1. A high node 25 will cause n-channel evaluation device 30 to conduct, pulling output terminal 36 low and node 44 high. As is evident from the foregoing, cascaded domino logic stages 2 and 32 of FIG. 2 implement the Boolean function (A.B.C)+D.

Although domino logic circuits offer advantages in area and speed, there are several disadvantages. In complex circuits involving many cascaded domino gates, the capacitive loading on the common clock line, e.g. CLK signal 22, could be unacceptably high. This is due to the fact that a common clock must simultaneously clock all the stages of a given domino circuit. Furthermore, that common clock is used to control both the precharge device and the discharge device in each stage.

Another problem relates to charge redistribution. Domino logic suffers from charge redistribution because there may be enough parasitic capacitance in the serial devices of the evaluation tree, e.g. devices 10, 12, 14, 16, and 18, to cause the potential at the precharged output terminal, e.g. output terminal 23, to fall below the switching threshold although there is no actual electrical path to ground. Charge redistribution decreases the reliability of the circuitry because it may cause the output terminal to falsely switch during the evaluation phase.

Furthermore, all stages in a domino circuit must complete their evaluation before anyone stage can begin to precharge. For example, the circuit of FIG. 2 must wait until domino stage 32 completes its evaluation before stage 2 can begin to precharge. When numerous stages are cascaded with the output of each stage dependent on the result from the evaluation of a previous stage, this delay can become significant.

Thus, there exists a need for an improved CMOS circuit that can reduce the capacitive loading on the common clock line. The improved CMOS circuit preferably employs fewer devices in the evaluation tree to alleviate charge redistribution and charge sharing problems. Further, it is preferable that the improved CMOS circuit permits pipelining, i.e., the ability of different stages of a circuit to perform different tasks at different times. To improve performance, the improved CMOS circuit preferably includes circuitry to improve the noise margin and reduce the instantaneous peak current as well as power consumption.

SUMMARY OF THE INVENTION

The invention relates to a circuit having a first clock terminal and a first circuit stage. The first circuit stage includes a pulse generation circuit coupled to the first clock terminal. The first circuit stage further includes an output terminal, an evaluation device coupled to the output terminal and the pulse generation circuit, and a precharge device coupled to the output terminal and a first logic level.

According to one aspect of the invention, the pulse generation circuit includes a first inverter having an inverter output coupled to the evaluation device. The pulse generation circuit further includes a NAND gate having a first NAND input coupled to a data terminal, a second NAND input coupled to the first clock terminal, and a NAND output coupled to an input of the first inverter.

According to another aspect of the invention, the first inverter further includes a first p-channel device coupled to the first logic level, the evaluation device, and the NAND output. The first inverter also includes a second clock terminal and a first n-channel device coupled to the first p-channel device, the evaluation device, the second clock terminal, and a second logic level.

In another embodiment, the circuit further includes a second circuit stage, which in turn includes a second stage output terminal, a second stage evaluation device coupled to the second stage output terminal, and an inverter coupled in series between the output terminal of the first circuit stage and the second stage evaluation device. The second circuit stage also includes a second stage precharge device coupled to the second stage output terminal and the first logic level.

In another embodiment, the first circuit stage further includes a forward conduction device coupling the output terminal to the first logic level and the evaluation device. Alternatively, the first circuit stage further includes a feedback device coupled to the evaluation device, the first p-channel device, the first n-channel device, and the evaluation device.

Another aspect of the invention relates to a method for improving performance in a circuit, including the step of providing a clock terminal and a first circuit stage. The step of providing the first circuit stage further includes the steps of coupling a pulse generation circuit to the first clock terminal, providing an output terminal, and coupling a first stage evaluation device to the output terminal and the pulse generation circuit. The step of providing the first circuit stage also includes the step of coupling a first stage precharge device to the output terminal and a first logic level.

In another embodiment, the inventive method further includes the step of providing a second circuit stage, which step further includes the steps of providing a second stage output terminal and coupling a second stage evaluation device to the second stage output terminal. The step of providing the second circuit stage further includes the steps of coupling an inverter in series between the output terminal of the first circuit stage and the second stage evaluation device and coupling a second stage precharge device to the second stage output terminal and the first logic level.

Because the stages of the wave propagation circuit of the present invention precharge and evaluate in a serial, wave-like manner, the capacitive loading on a common clock is substantially reduced. Further, the serial, wave-like nature of the precharge and evaluation phases from stage to stage means that it is possible to begin precharging a preceding propagation circuit stage when a given propagation circuit stage of the wave propagation circuit still evaluates its inputs. Consequently, the clock can operate at a higher frequency, thereby improving performance. As compared to the prior art domino logic circuit, the reduction in the number of serial devices of the evaluation tree in each stage advantageously alleviates the charge distribution problem, increases the drive strength of the driving stage or reduces the capacitance of a stage as seen from the perspective of the circuit that drives that stage.

These and other features of the present invention will be presented in more detail in the following specification of the invention, the figures, and the appended claims.

DESCRIPTION OF THE PREFERRED EMBODIMENT

Figure 3A:
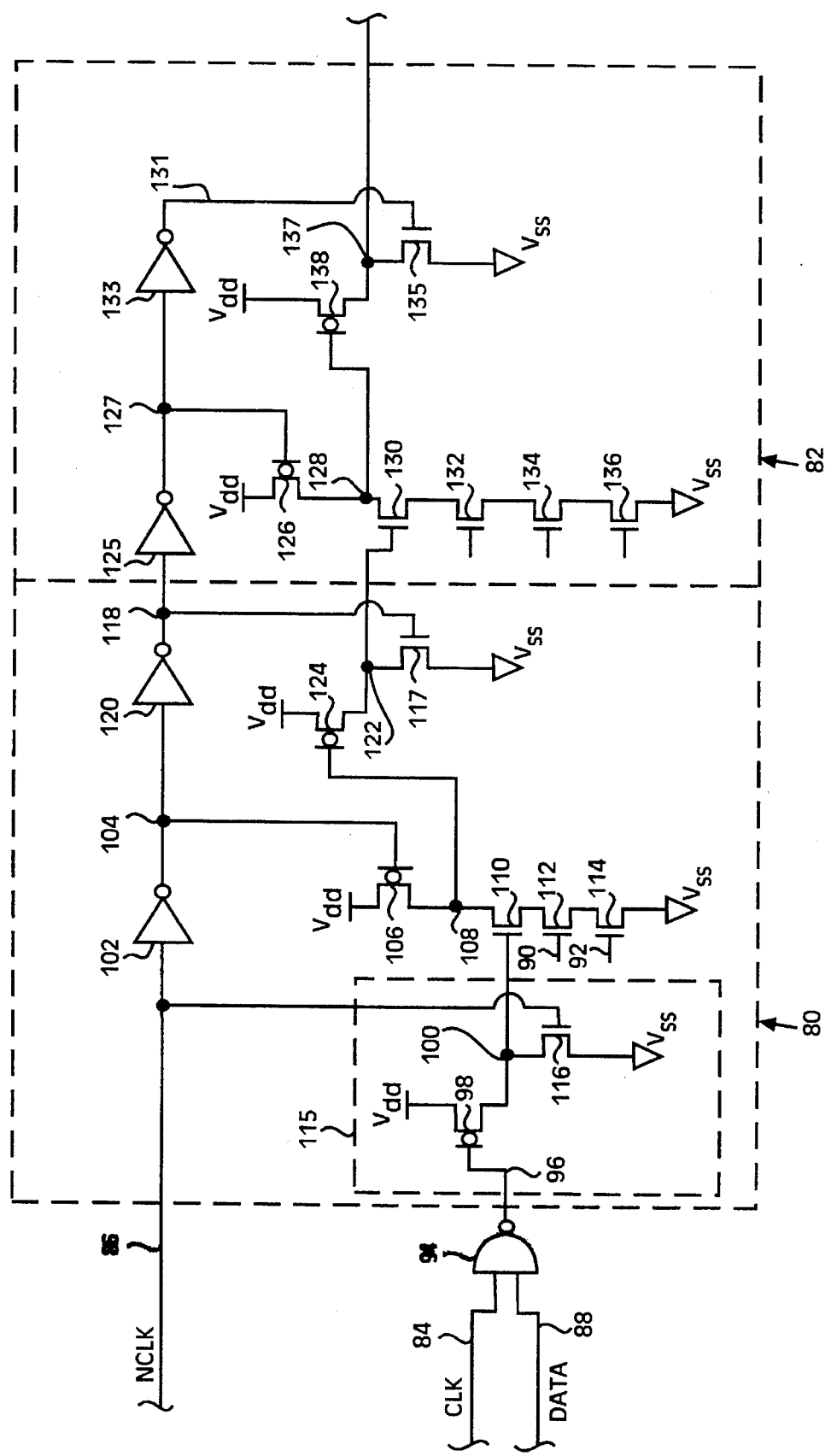
FIG. 3A shows in simplified form a NAND-gate based wave propagation circuit in accordance with one aspect of the present invention.
Figure 4:
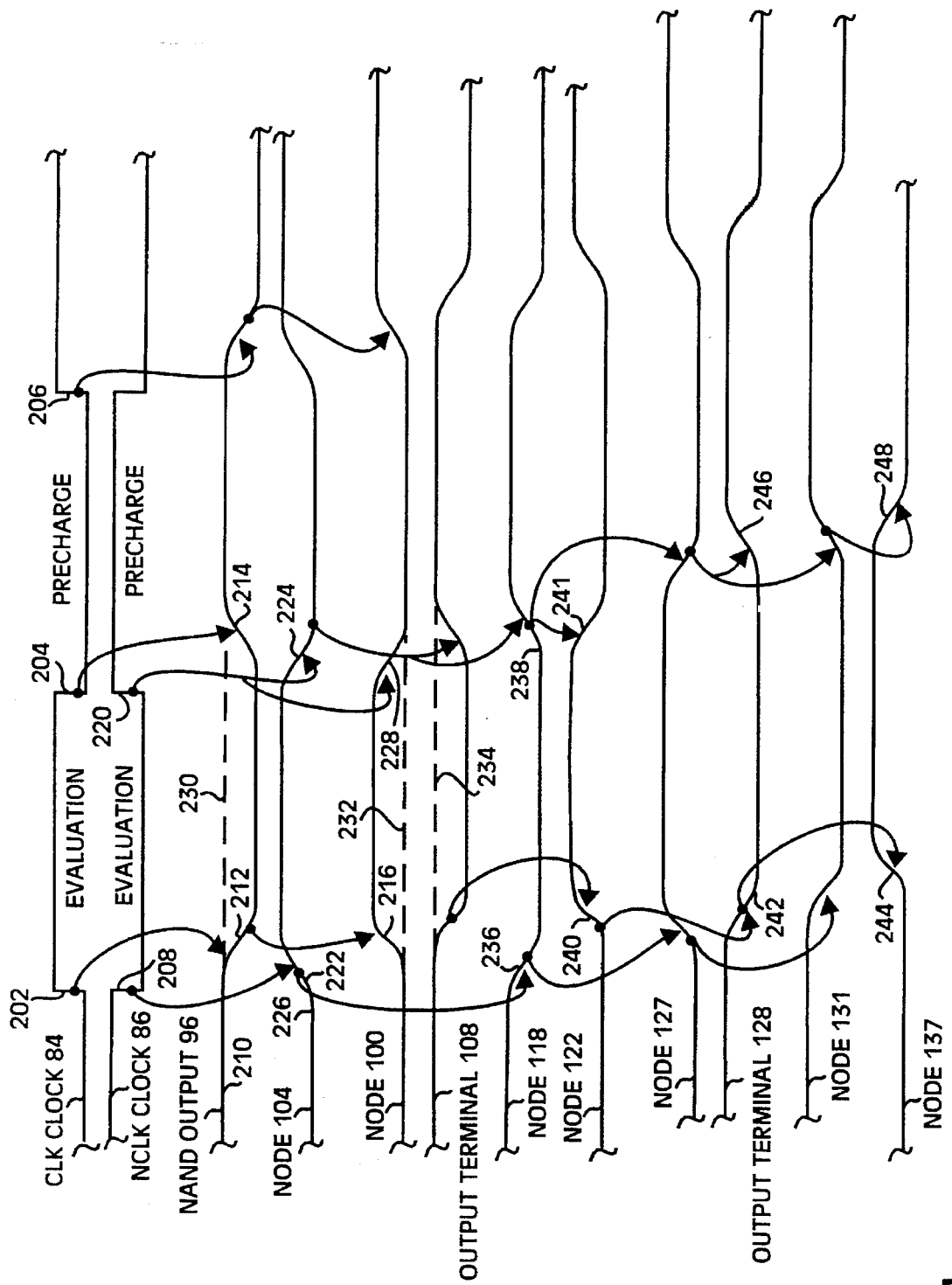
FIG. 4 shows in simplified form a timing diagram showing the activities on various nodes of the circuit of FIG. 3A during precharge and evaluation.

FIGS. 3A and 4 show in simplified form a NAND-gate based wave propagation circuit and its timing diagram in accordance with one aspect of the present invention. The circuit of FIG. 3A is NAND-gate based because it uses a NAND gate to generate a pulsed data signal. The circuit of FIG. 3A includes two propagation circuit stages 80 and 82. In each stage, there are preferably as many evaluation devices, e.g. devices 110, 112, and 114, as the number of logic inputs, e.g. signals 88, 90, and 92. In response to a precharge pulse on the clock input, e.g. clock signal CLK 84, first propagation circuit stage 80 and second propagation circuit stage 82 serially precharge their respective output terminals, e.g. nodes 100 and 137 respectively. When the clock, e.g. clock signal CLK 84, enters its evaluation phase, a pulsed data signal is used to begin the evaluation of first propagation circuit stage 80 to generate an output pulse. Thereafter, the output pulse from first propagation circuit stage 80 is buffered and propagated to second propagation circuit stage 82 to begin the evaluation of second propagation circuit stage 82. In this manner, precharge and evaluation occur in a wave-like, serial manner from stage to stage of the wave propagation circuit.

The operation of the wave propagation circuit of FIG. 3A can be best understood when considered together with the timing diagram of FIG. 4. For ease of understanding, circuit components of FIG. 3A are referred herein by reference numerals in the range from 50–199. On the other hand, the timing traces of FIG. 4 are referred herein by reference numerals in the range of 200–299.

Referring to FIG. 3A, a two-stage wave propagation logic circuit comprising propagation circuit stages 80 and 82 is shown. Clock signal CLK 84 has two phases: an evaluation phase between clock edge 202 and clock edge 204, and a precharge phase between clock edge 204 and clock edge 206. When clock signal 84 goes high at clock edge 202, NCLK clock 86 goes low at transition edge 208. In the specific embodiment disclosed in FIG. 3A, both CLK clock 84 and NCLK clock 86 are generated by a clock circuit of the types well known in the art (not shown) and switch in opposite directions substantially simultaneously. However, it should be noted that another clock, say a delayed version of CLK, may be substituted for NCLK clock 86 in certain applications without departing from the scope and spirit of the invention. The generation of such clock, as well as any adaptation to permit the disclosed invention to work with such clock, is well within the abilities of those skilled in the art.

As shown in FIG. 3A, both clock CLK 84 and a data signal 88 serve as inputs to a NAND gate 94. When CLK clock 84 is low prior to transitioning to a high state at transition edge 202 at the beginning of the evaluation phase, NAND output 96 of NAND gate 94 is high. This is shown by reference numeral 210 in FIG. 4. When CLK clock 84 goes high at transition edge 202 and data signal 88 is high, NAND gate 94 will cause NAND output 96 to go low at transition edge 212. NAND output 96 will stay low until CLK clock 84 goes low at transition edge 204 and enters the precharge state. When this happens, NAND output 96 of NAND gate 94 will go high as shown at edge 214.

When NAND output 96 goes low at transition edge 212, p-channel device 98 pulls node 100 high at transition edge 216. Node 100 will stay high until pulled low by n-channel device 116 when NCLK clock 86 switches from low to high at transition edge 220 at the start of the precharge phase. Note that p-channel device 98 and n-channel device 116 together function as a dynamic inverter in the circuit of FIG. 3A. Although not required, dynamic inverters are preferable because of their advantages in area and speed. As is apparent, NAND gate 94, p-channel device 98 and n-channel device 116 function together as a pulse generation circuit to furnish a pulsed data signal to the circuit of FIG. 3A. FIG. 4 also shows that when NCLK clock 86 goes from high to low at transition edge 208 at the beginning of the evaluation phase, inverter 102 causes node 104 to go high at transition edge 222. Node 104 is kept high until the next low-to-high transition of NCLK clock 86 at transition edge 220 at the beginning of the precharge phase, causing node 104 to go from high to low at transition edge 224.

Node 104 stays low prior to transitioning to a high state at transition edge 222. The low state of node 104 during the period shown by reference numeral 226 turns on p-channel precharge device 106, connecting output terminal 108 to Vdd. During the period indicated by reference numeral 226 before transition edge 222, node 100 is low, turning off n-channel evaluation device 110 and disconnecting output terminal 108 from Vss. Output terminal 108 is precharged high via p-channel precharge device 106 during the precharge period.

If data signal 88 is low during the evaluation period, NAND output 96 will be high by the operation of the NAND gate 94. This is shown graphically by the dashed line and reference numeral 230 on the timing diagram of FIG. 4. When node 96 stays high because data signal 88 is low during the evaluation period, p-channel device 98 is not turned on, and node 100 stays low. The state of node 100 in this situation is shown graphically by the dashed line associated with reference numeral 232 in FIG. 4. When node 100 stays low due to a low data signal 88, n-channel evaluation device 110 does not conduct during the evaluation phase. Even if the inputs 90 and 92 to respective n-channel evaluation devices 112 and 114 are high, output terminal 108 still stay at its precharged high during this evaluation phase, as shown graphically by the dashed line 234 in the timing diagram of FIG. 4.

Alternatively, if data signal 88 had been high, node 96 would have been low during the evaluation period, causing node 100 to pull high via p-channel device 98. The high state of node 100 in turn causes n-channel evaluation device 110 to conduct, thereby pulling output terminal 108 to Vss (assuming inputs 90 and 92 are high at some point during the evaluation phase).

In any event, output terminal 108 is again pulled high when NCLK clock 86 goes high at the beginning of the precharge phase. When NCLK clock 86 goes high, node 104 goes low, turning on p-channel precharge device 106. For ease of illustration, the discussion of propagation circuit stage 82 and the remaining portions of the circuit of FIG. 3A relates only to the situation when data signal 88 is high and the inputs 90 and 92 to respective n-channel evaluation devices 112 and 114 are high. The behavior of the circuit of FIG. 3A when data signal 88 is low is readily deducible from the circuit diagram of FIG. 3A, from the timing diagram of FIG. 4, and from the discussions herein.

When node 104 goes from low to high at transition edge 222 at the beginning of the evaluation phase of the clock, node 118 goes from high to low due to the operation of inverter 120. This is shown graphically by transition edge 236. Node 118 will stay low until node 104 changes from high to low at transition edge 224, causing node 118 to go from low to high at transition edge 238. Further, when output terminal 108 changes from high to low during evaluation (i.e., data signal 88 is high and n-channel devices 112 and 114 are on during the evaluation phase), node 122 goes from low to high due to the operation of p-channel device 124. This is shown graphically by transition edge 240 on the timing diagram of FIG. 4. Node 122 will stay high until pulled low by the low to high transition edge 238 of node 118 at the beginning of the; precharge phase. This is because the high state of node 118 causes n-channel device 117 to conduct, connecting node 122 to Vss and pulling node 122 low at transition edge 241. As is apparent, p-channel device 124 and n-channel device 117 perform the function of a dynamic inverter/buffer to switch the polarity of the signal on output terminal 108 at appropriate times.

On the other hand, the high-low transition of node 118 at transition edge 236 at the beginning of the evaluation phase causes node 127 to go high via the operation of inverter 125. Note that when node 127 was low and node 122 was low before the evaluation period, p-channel precharge device 126 connects output terminal 128 to Vdd and disconnects output terminal 128 from Vss, causing output terminal 128 to precharge in a manner similar to the precharging of output terminal 108.

As the low NCLK clock 86 propagates through inverters 102, 120, 125 and reaches node 127, node 127 goes from low to high, turning off p-channel precharge device 126. Node 122 goes high at transition edge 240, coupling output terminal 128 to Vss via n-channel devices 130, 132, 134, and 136 (assuming the inputs to the gates of n-channel devices 130, 132, 134, and 136 are all high some time during the evaluation phase of propagation circuit stage 82). The transitioning from high to low of output terminal 128 during evaluation is shown at transition edge 242 in FIG. 4. Further, when node 127 goes high, node 131 goes low via the operation of inverter 133. When node 131 goes low, n-channel device 135 is shut off, disconnecting node 137 from Vss. When output terminal 128 goes low at transition edge 242 as discussed earlier, p-channel device 138 causes node 137 to go high. This is shown graphically at transition edge 244 in FIG. 4. Output terminal 128 will stay low until pulled high by p-channel precharge device 126 when node 127 goes low. When node 127 goes low, output terminal 128 is coupled to Vdd via p-channel precharge device 126 and goes high at transition edge 246.

Node 137 continues to stay high until pulled low by n-channel device 135 when node 131 goes high. The transition from high to low of node 137 at transition edge 248 represents the precharging to Vss of the input to a propagation circuit stage (not shown) subsequent to propagation circuit stage 82.

As is readily apparent from the foregoing, evaluation proceeds in a wave-like fashion from a first propagation circuit stage 80 to a second propagation circuit stage 82 and onto subsequent propagation circuit stages of the wave propagation circuit of the present invention. Likewise, the precharge phase proceeds in a wave-like fashion permitting evaluation and precharge to occur in a distributed, serial manner. A clock pulse, via either a NAND gate, a NOR gate, and the like, is used to evaluate the first propagation circuit stage. The result of the evaluation of the first propagation circuit stage propagates to subsequent propagation circuit stages to serially evaluate those subsequent propagation circuit stages. Precharge of the first propagation circuit stage is also accomplished via a pulse. That precharge pulse is permitted to propagate to subsequent propagation circuit stages to serially precharge those subsequent propagation circuit stages. Further, it is no longer necessary to slow down the clock and wait until all propagation circuit stages complete their evaluation before the first propagation circuit stage can precharge. The serial, wave-like nature of the precharge and evaluation phases from stage to stage means that it is possible to begin precharging a preceding propagation circuit stage when a given propagation circuit stage of the wave propagation circuit still evaluates its inputs. Consequently, the clock can operate at a higher frequency, thereby improving performance.

Figure 1:
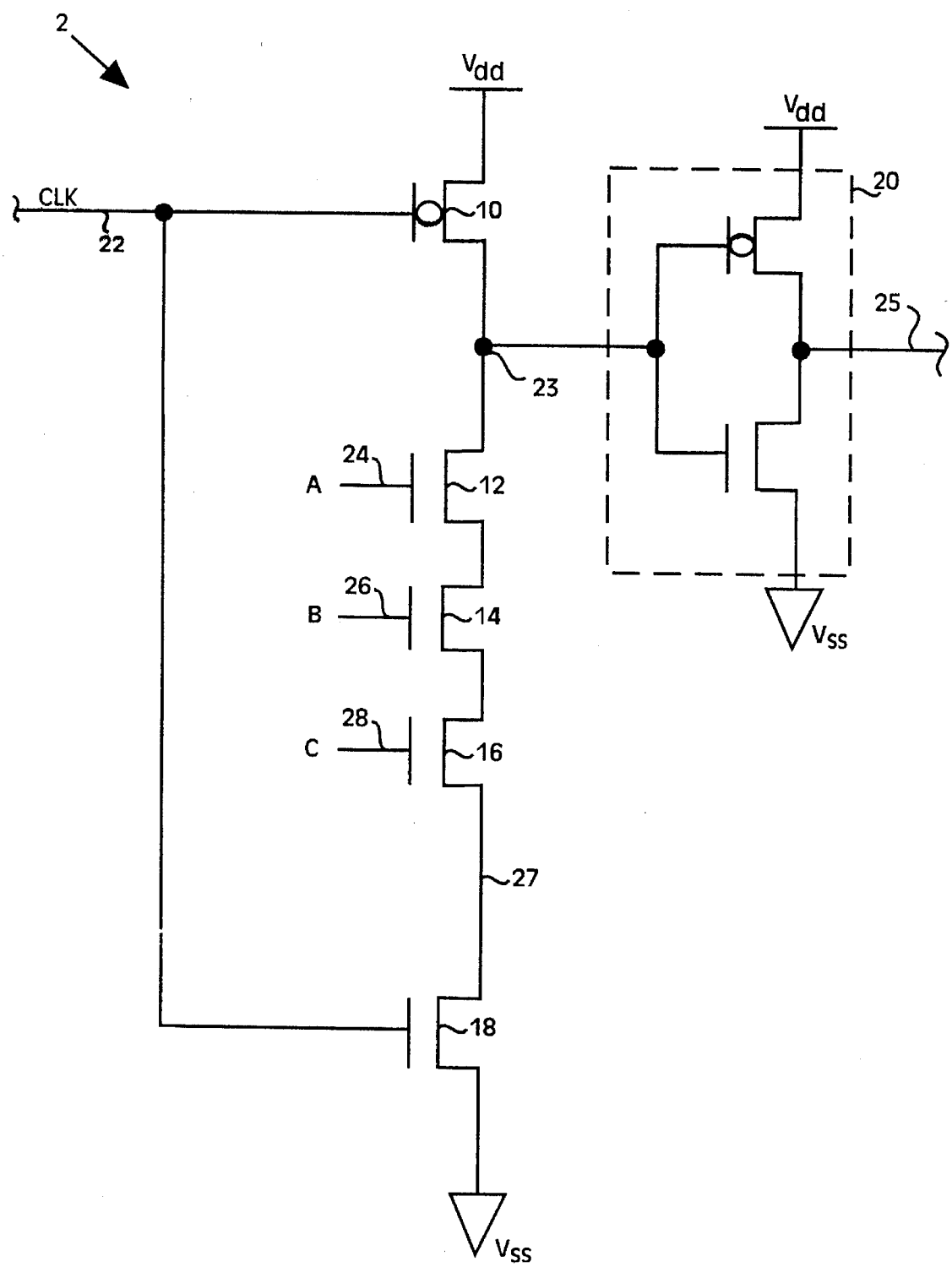
FIG. 1 shows a typical prior art domino logic.
Figure 2:
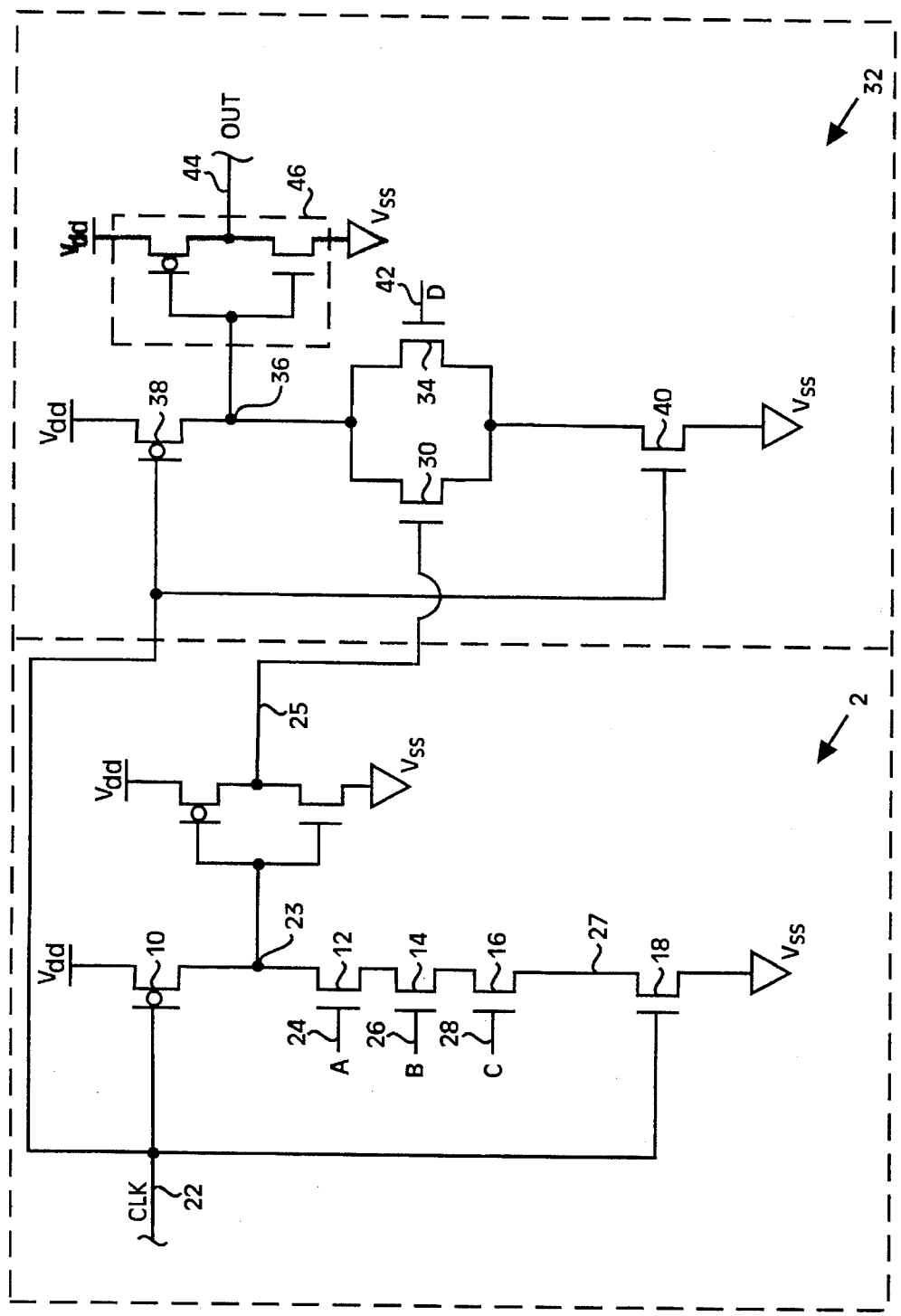
FIG. 2 shows a prior art domino circuit having multiple stages.

Further, compared to domino logic, the n-channel discharge device at the bottom of the evaluation tree of the typical domino logic circuit, e.g. device 18 or 40 of FIG. 2, is no longer necessary. In the circuit of the present invention, the number of evaluation devices in a given propagation stage equals the number of logic inputs in that stage. The reduction in the number of serial devices advantageously reduces the capacitive loading on the clock, the instantaneous peak current, and substantially increases the drive strength of the driving propagation circuit stage.

Note that the circuit of FIG. 3A advantageously prevents the existence of a discharge path from Vdd to Vss, thereby conserving power and preventing an erroneous output. A discharge path exists if, for example, both p-channel precharge device 106 and n-channel evaluation device 110 of propagation circuit stage 80 are permitted to turn on simultaneously. The circuit of FIG. 3A advantageously does not permit this condition to occur. To illustrate, consider p-channel precharge device 106 and n-channel evaluation device 110 during precharge. During precharge, p-channel device 106 is on and n-channel evaluation device 110 is off as discussed earlier. When evaluation begins, CLK and NCLK clocks are switched substantially simultaneously as discussed. P-channel precharge device 106 is shut off before a high data pulse can turn on n-channel evaluation device 110. This is because NCLK clock 86 only has to traverse one inverter 102 prior to turning off p-channel device 106. On the other hand, the CLK clock 84 (and data signal 88) has to traverse both NAND gate 94 and p-channel device 98 of the dynamic inverter prior to arriving at node 100 to switch n-channel evaluation device 110. Consequently, a discharge path from Vdd to Vss via devices 106 and 110 is avoided.

Further, inverters may be faster than NAND gates. This is particularly true if inverters are made dynamic. The delay time for inverters are typically 250 picoseconds while NAND gates typically have a 350 picosecond delay. The safety margin is consequently greater due to the difference in the inherent delay times of NAND gates and inverters. Another safety margin lies in the fact that data sometimes arrives later than the transition edge of the clock. In the circuit of FIG. 3A, for example, data signal 88 sometimes arrives after CLK clock 84 goes high. Consequently, the pulsed data signal typically arrives at node 100 sometime after CLK clock 84 enters its evaluation phase.

Figure 3B:
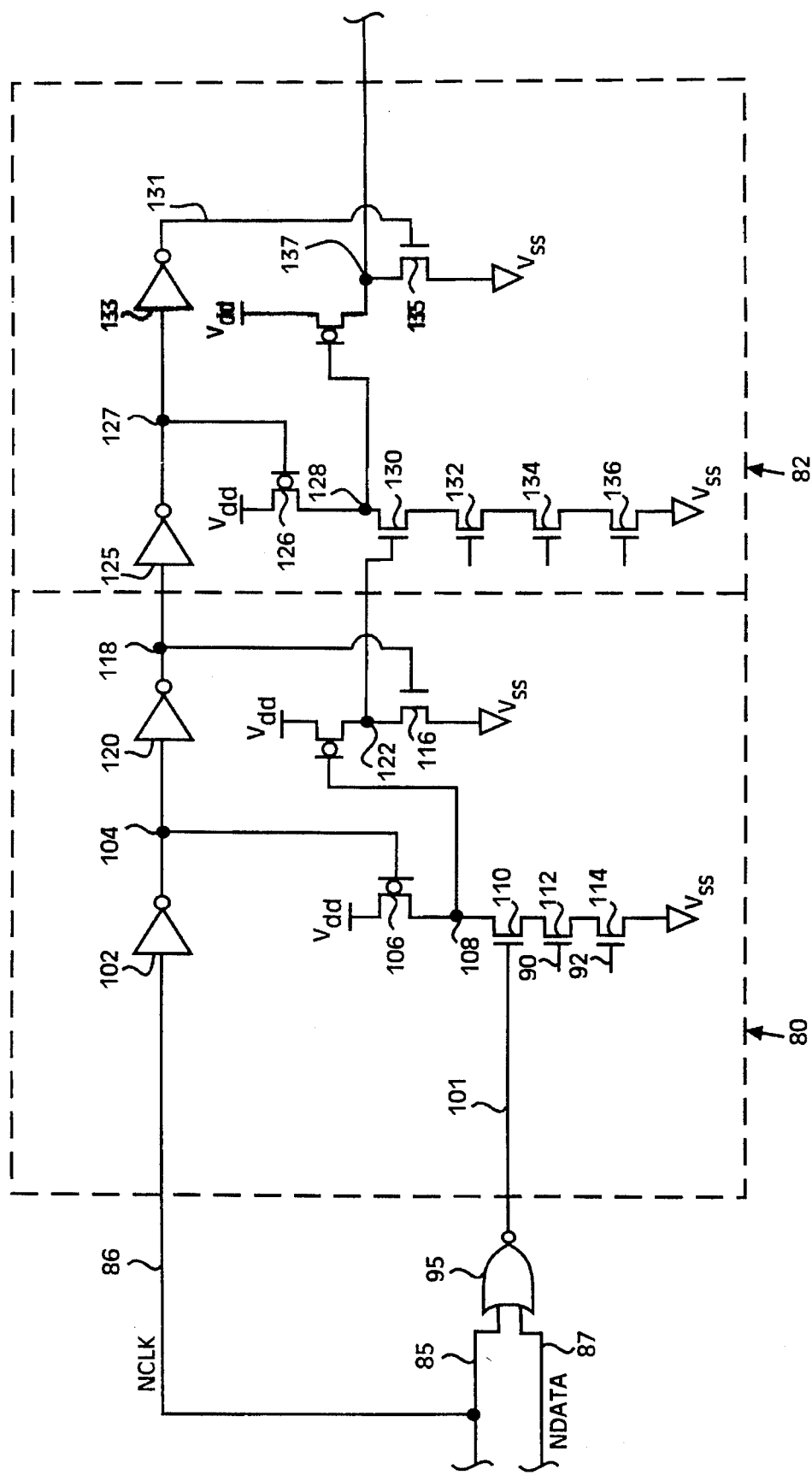
FIG. 3B shows in simplified form a NOR-gate based wave propagation circuit in accordance with another aspect of the present invention.

FIG. 3B is essentially the circuit of FIG. 3A with the exception that the pulsed data signal at node 101 of FIG. 3B is generated via a NOR gate. In the circuit of FIG. 3B, the dynamic inverter, shown by a pair of devices 98 and 116 in FIG. 3A, are no longer necessary. Further, NOR input 85 of NOR gate 95 is coupled directly to NCLK clock 86. The other NOR input 87 of NOR gate 95 is coupled to Ndata, to trigger off the negative edge of the data pulse.

In another embodiment, the invention advantageously terminates the precharge phase early to prevent the existence of the aforementioned undesirable discharge path from Vdd to Vss as well as the associated speed loss. The precharge phase begins when the clock enters its precharge cycle as previously mentioned. However, the precharge phase is terminated after a predetermined period of time instead of at the end of the precharge cycle of the clock.

Figure 5:
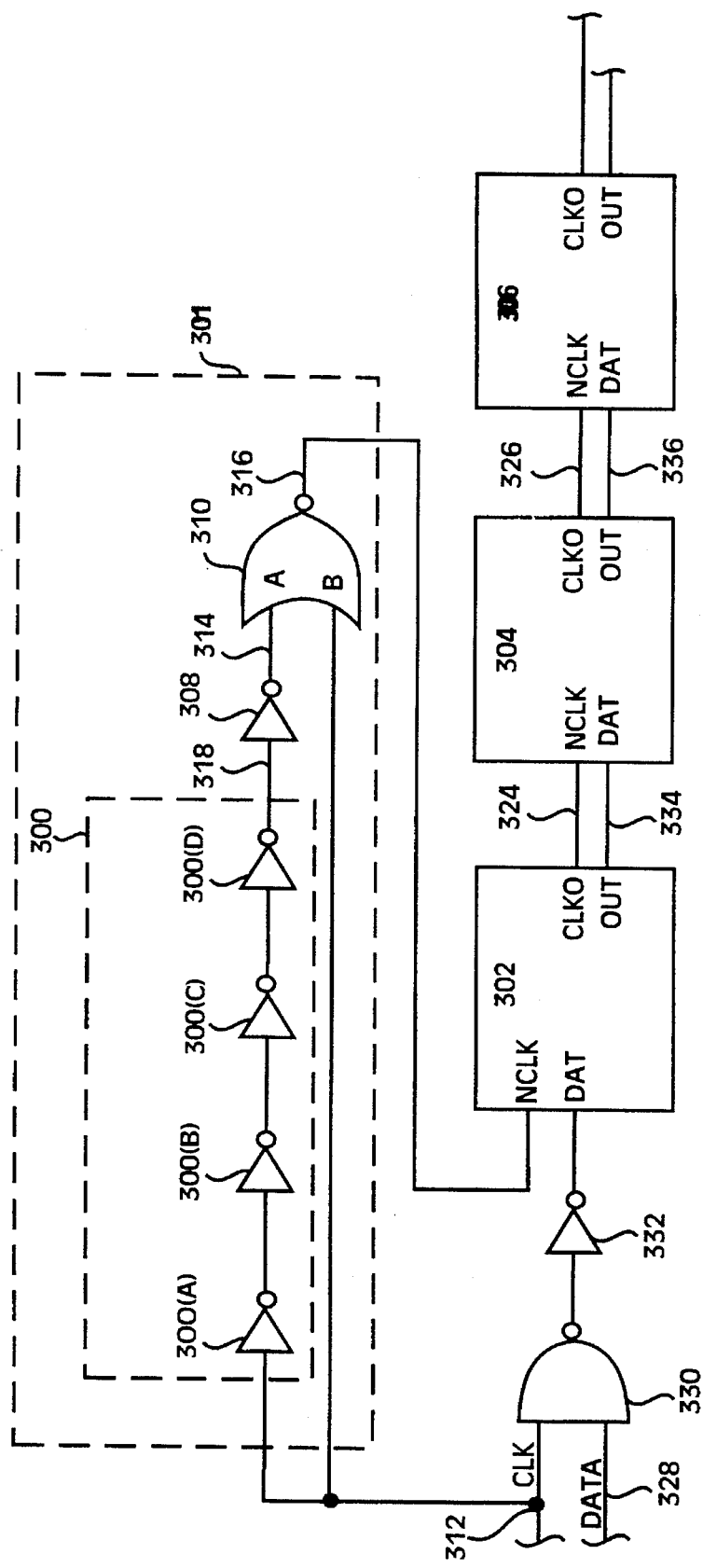
FIG. 5 shows another embodiment of the wave propagation circuit including a pulsed precharge circuit.

Referring to FIG. 5, a wave propagation circuit including a pulse circuit 301 for generating a precharge pulse of a fixed duration is shown. The duration of the precharge pulse is substantially determined by the delay of a delay circuit 300 in pulse circuit 301. For illustration purposes, four inverter gates 300(A)–(D) are used in the circuit of FIG. 5 to implement delay circuit 300, although it should be understood that delay circuit 300 may be implemented using any type of conventional delay techniques well known in the art. There is also shown in FIG. 5 a plurality of wave propagation circuit stages 302, 304, and 306, each of which may include one or more propagation circuit stages. To illustrate the operation of the circuit of FIG. 5, consider the situation when CLK clock 312 goes from high to low, beginning the precharge cycle. When CLK clock 312 switches from high to low, input B to NOR gate 310 also goes from high to low. However, input 314 coupled to input A of NOR gate 310 is still low from the previous evaluation cycle (when CLK clock 3 12 was high). Consequently NOR output 316 goes high, passing an NCLK high pulse to wave propagation circuit 302 to precharge the circuit stages therein.

After being delayed by delay circuit 300, the high-to-low pulse of CLK clock 312 reaches node 318 and is then inverted by inverter 308, creating a low-to-high pulse at input 314. This low-to-high pulse on input 314 combines with the already low pulse of on CLK clock 312 at input B of NOR gate 310 causes NOR output 316 to go low. In effect, a clock pulse having a fixed width is passed to wave propagation circuit 302 to precharge its nodes. This precharge pulse propagates through the propagation circuit stages of circuit 302 and onto subsequent circuits 304 and 306 via conductors 324 and 326 respectively. When CLK clock 312 goes from low to high to begin evaluation, the precharge phase had been terminated for some time. The high CLK clock 312 is combined with a data signal 328 by NAND gate 330 and inverter 332, causing a data pulse to enter the DAT input of wave propagation circuit 302 to begin evaluation. The result of the evaluation of wave propagation circuit 302 is propagated onto wave propagation circuits 304 and 306 via conductors 334 and 336 respectively.

As is evident from the foregoing, the precharge phase is initiated by CLK clock 312 and is advantageously terminated after a predetermined delay time which may be substantially earlier than the beginning of the evaluation phase. Further, it is contemplated and within the ability of one of ordinary skills in the art given this disclosure to make the evaluation phase begin substantially at the end of the precharge phase. As in the case of the wave propagation circuit of FIG. 3A, evaluation ends as expected on the high-to-low transition of the CLK clock. To maximize circuit performance, delay 300 may be made variable to flexibly create an optimum precharge pulse which is sufficient to precharge the output terminal of the wave propagation circuit while short enough in time to prevent an undesirable discharge path from Vdd to Vss.

Figure 6:
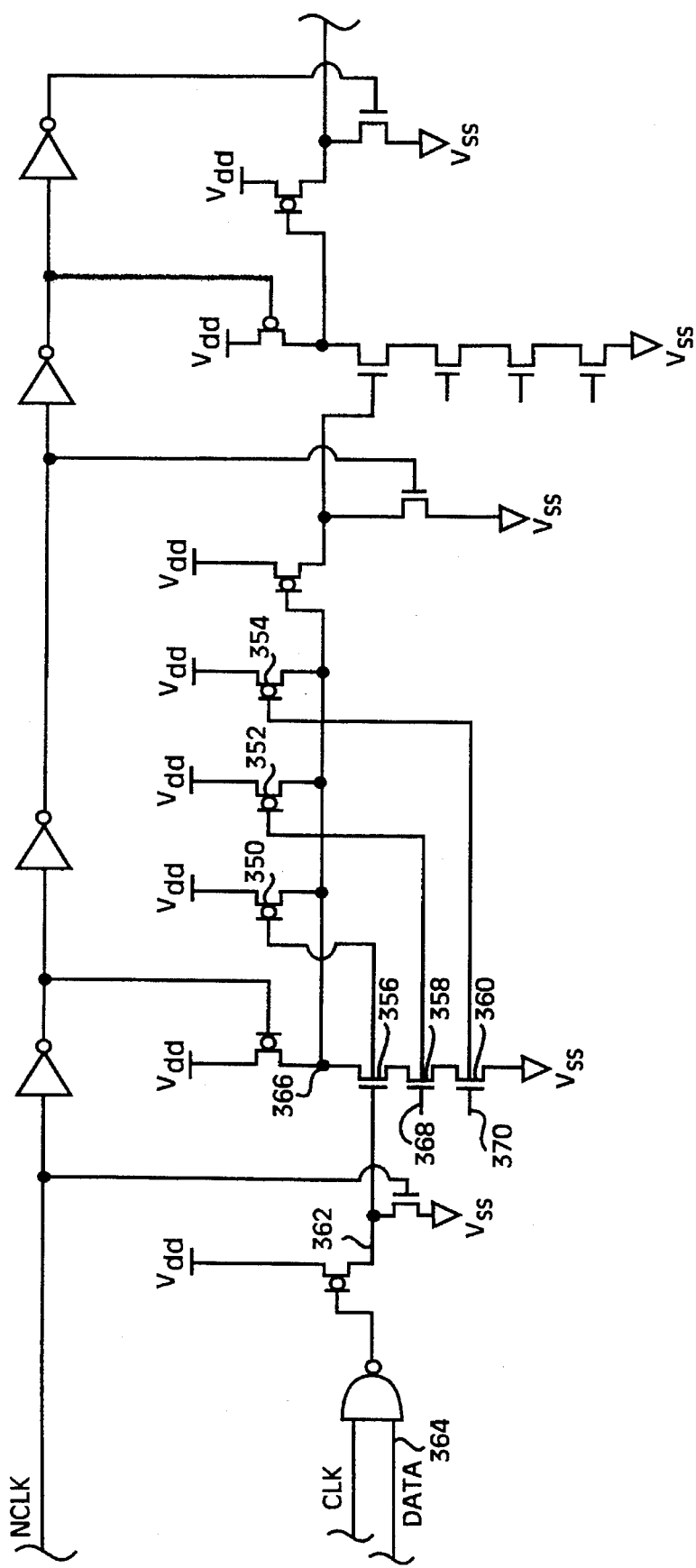
FIG. 6 shows in a simplified circuit diagram another embodiment of the wave propagation circuit, including p-channel forward conduction devices.

In yet another aspect of the invention, the wave propagation circuit advantageously employs optional small forward conduction devices to improve the noise margin and to reduce output errors caused by charge leakage from the precharged output terminals, as well as by charge sharing between the precharged output terminals and the evaluation devices. FIG. 6 shows in a simplified circuit diagram an improved wave propagation circuit, including p-channel forward conduction devices 350, 352, and 354 coupled to n-channel evaluation devices 356, 358, and 360, respectively. To illustrate the operation of the forward conduction scheme, consider the situation during evaluation when node 362 is high (e.g. due to a high data input on data input 364) and n-channel evaluation device 356 is on. Assume that n-channel evaluation device 358 is also on and n-channel evaluation device 360 is off. In the absence of p-channel forward conduction devices 350, 352, and 354, the parasitic capacitance associated with the activated n-channel evaluation devices 356 and 358 may be sufficient to cause output terminal 366 to switch from its precharged high to low although n-channel evaluation device 360 is actually off, and there is no actual discharge path to Vss. With the forward conduction devices in the circuit, however, the appropriately sized p-channel forward conduction device 354 associated with n-channel device 360 will be turned on by the low signal 370, thereby pulling output terminal 366 toward Vss. Consequently, output terminal 366 is less likely to switch falsely due to charge sharing.

The forward conduction devices also improve the circuit's noise margin. When a glitch occurs on node 362, n-channel evaluation device 356 may begin to conduct. Assume inputs 368 and 370 are high, the glitch may cause enough charge to flow through n-channel evaluation devices 356, 358, and 360 to cause output terminal 366 to falsely switch in the absence of forward conduction device 350. With the presence of p-channel conduction device 350 in the circuit of FIG. 6, unless the glitch causes node 362 to go to Vdd, appropriately sized p-channel forward conduction device 350 will not be shut off completely by the glitch and will continue to pull output terminal 366 toward Vdd, resisting the glitch-induced transition.

The forward conduction devices further reduce erroneous outputs caused by charge leakage. If n-channel evaluation devices 356, 358, and 360 are off during evaluation, output terminal 366 should theoretically stay at its precharged high even in the absence of p-channel forward conduction devices 350, 352, and 354. Without forward conduction devices 350, 352, and 354, however, enough charges may in reality be leaked from output terminal 366, particularly during a lengthy evaluation period, to cause the potential at output terminal 366 to fall below the switching threshold and falsely switch. With the appropriately sized forward conduction devices in the circuit, the forward conduction devices stay on when the n-channel evaluation devices 356, 358, and 360 are off, advantageously supplying charges to precharged node 366 to counteract any leaked charges, thereby maintaining the potential of output terminal 366 at its precharged high state regardless of the length of the evaluation period.

Figure 7:
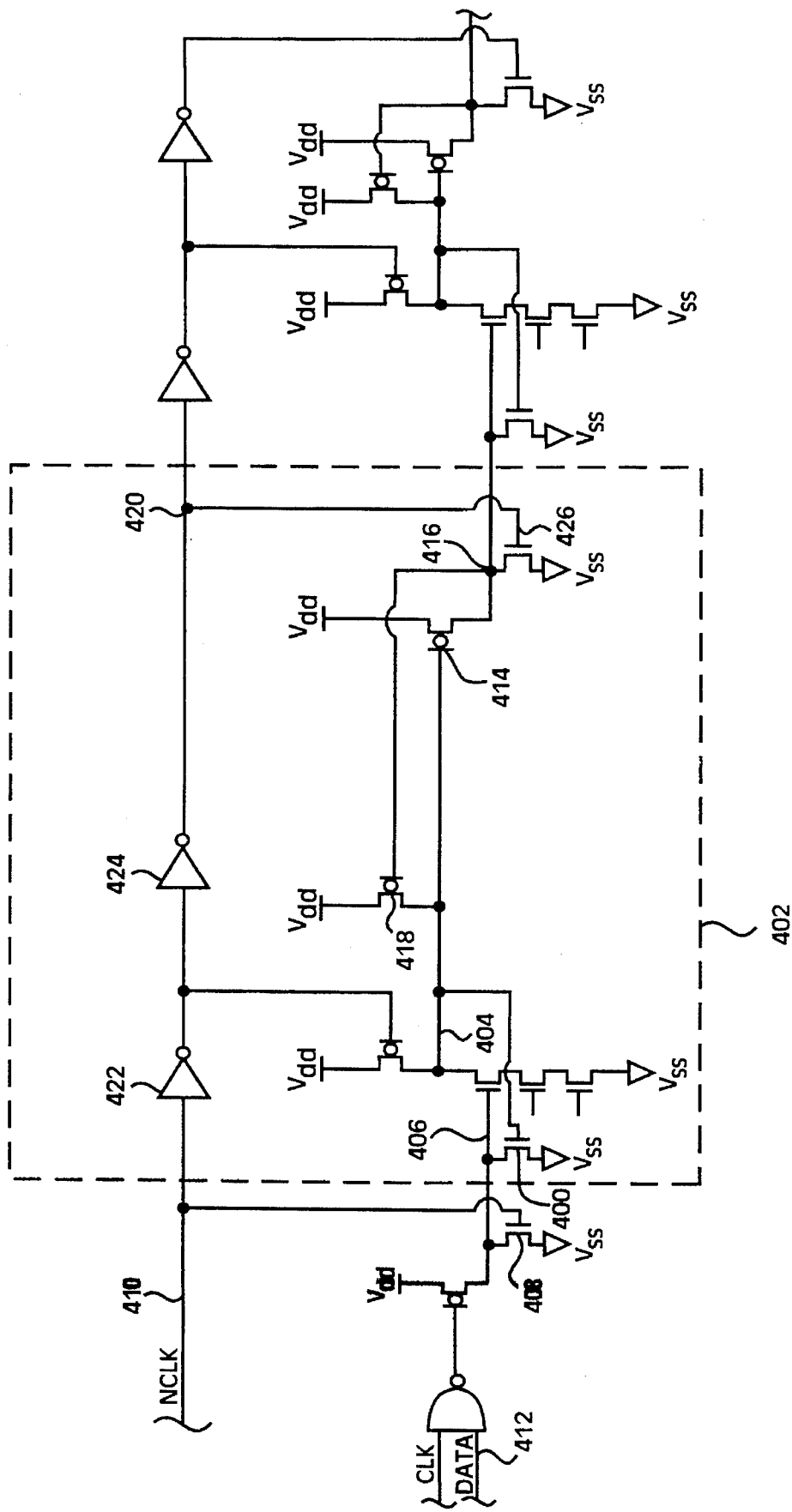
FIG. 7 shows in a simplified circuit diagram another embodiment of the wave propagation circuit, including n-channel and p-channel feedback devices.

In yet another embodiment, the wave propagation circuit employs optional feedback devices to improve the noise margin and reduce output errors caused by charge leakage and charge sharing. FIG. 7 shows in a simplified circuit diagram an n-channel feedback device 400 coupled to propagation circuit stage 402. During precharge, output terminal 404 is precharged high as discussed earlier. Node 406 is precharged low since n-channel device 408 is turned on by the high NCLK clock 410. When node 406 makes the transition from low to high at the beginning of the evaluation phase (assuming a high data input at conductor 412), output terminal 404 is still high from the previous precharge phase. A high output terminal 404 keeps the appropriately sized n-channel feedback device 400 on, resisting the low-to-high transition on node 406. Consequently, the circuit's noise margin is improved.

Without the feedback devices in the circuit, a glitch on node 406 may cause output terminal 404 to falsely switch. N-channel feedback device 400 resists the glitch-induced false switching in a similar manner. By continuing to pull node 406 toward Vss, feedback device 400 resists the spikes. Consequently, temporary glitches are less likely to cause output terminal 404 to switch falsely. Note that the circuit of FIG. 7 requires only one additional feedback device per propagation circuit stage. In comparison, the forward conduction scheme preferably has one forward conduction device per evaluation device.

Further, the feedback device of FIG. 7 can be made smaller than the forward conduction devices of FIG. 6, thereby advantageously reducing the capacitive load. Consider the situation where output terminal 404 begins to make to transition from high to low. Due to the delay inherent in p-channel device 414, the transition seen at output terminal 404 has not yet affected node 416. At the point in time when output terminal 404 begins to switch, node 416 is still precharged low from the previous precharge phase. Consequently, p-channel feedback device 418 still conducts substantially fully, resisting the transition from high-to-low of node 404. In contrast, the forward conduction device 350 of FIG. 6 begins to turn off when node 362 begins to make the transition from low to high. Forward conduction device 350 still tries to pull up output terminal 366 to resist the high-to-low switch caused by the low-to-high transition of node 362 (assuming inputs 368 and 370 are high). Being partially shut off, forward conduction device 350 does not have its full power available to it to resist the high-to-low transition on node 366. Necessarily, forward conduction device 350 must be made large to provide in its partially shut off state sufficient charges to output terminal 366 to maintain an acceptable noise margin.

The feedback circuit of FIG. 7 further reduces the load capacitance on the output terminals, thereby improving speed and performance. To illustrate, consider the load capacitance at output terminal 366 of the circuit of FIG. 6. The load capacitance at the output terminal includes the drain capacitances of p-channel forward conduction devices 350, 352, and 354, the gate capacitance of the p-channel device of the dynamic inverter, the drain capacitance of the precharge device, as well as the drain capacitance of one of the evaluation devices. In contrast, the load capacitance at output terminal 404 of the circuit of FIG. 7 includes only the drain capacitance of the one p-channel feedback device 418, the gate capacitance of the n-channel feed back device 400, the gate capacitance of the p-channel device 414 of the dynamic inverter, the drain capacitance of the precharge device, as well as the drain capacitance of one of the evaluation devices. Consequently, output terminal 404 of FIG. 7 drives a smaller capacitive load upon switching, as compared to the circuit of FIG. 6.

As mentioned earlier, another aspect of the present invention involves the use of dynamic inverters to buffer and invert the output of the propagation circuit stages. Because dynamic inverters are typically smaller and faster than static inverters, the use of dynamic inverters advantageously improves speed and decrease circuit size. In FIG. 7, output terminal 404 is coupled to the gate of a p-channel device 414. When output terminal 404 goes from high to low during an evaluation phase, p-channel device 414 is turned on, pulling node 416 to Vss. When output terminal 404 is precharged high due to the high NCLK clock 410, node 420 also goes high via inverters 422 and 424. The high state of node 420 causes n-channel device 426 to conduct, pulling node 416 low. Together, p-channel device 414 and n-channel device 416 perform the function of an inverter. It should be noted that the dynamic inverter illustrated in FIG. 7 can be adapted to work with any of the embodiments described or inherent in this disclosure. Likewise, the circuit of FIG. 7 can be adapted to work with any type of inverter circuit known in the art, including static inverters.

Figure 8:
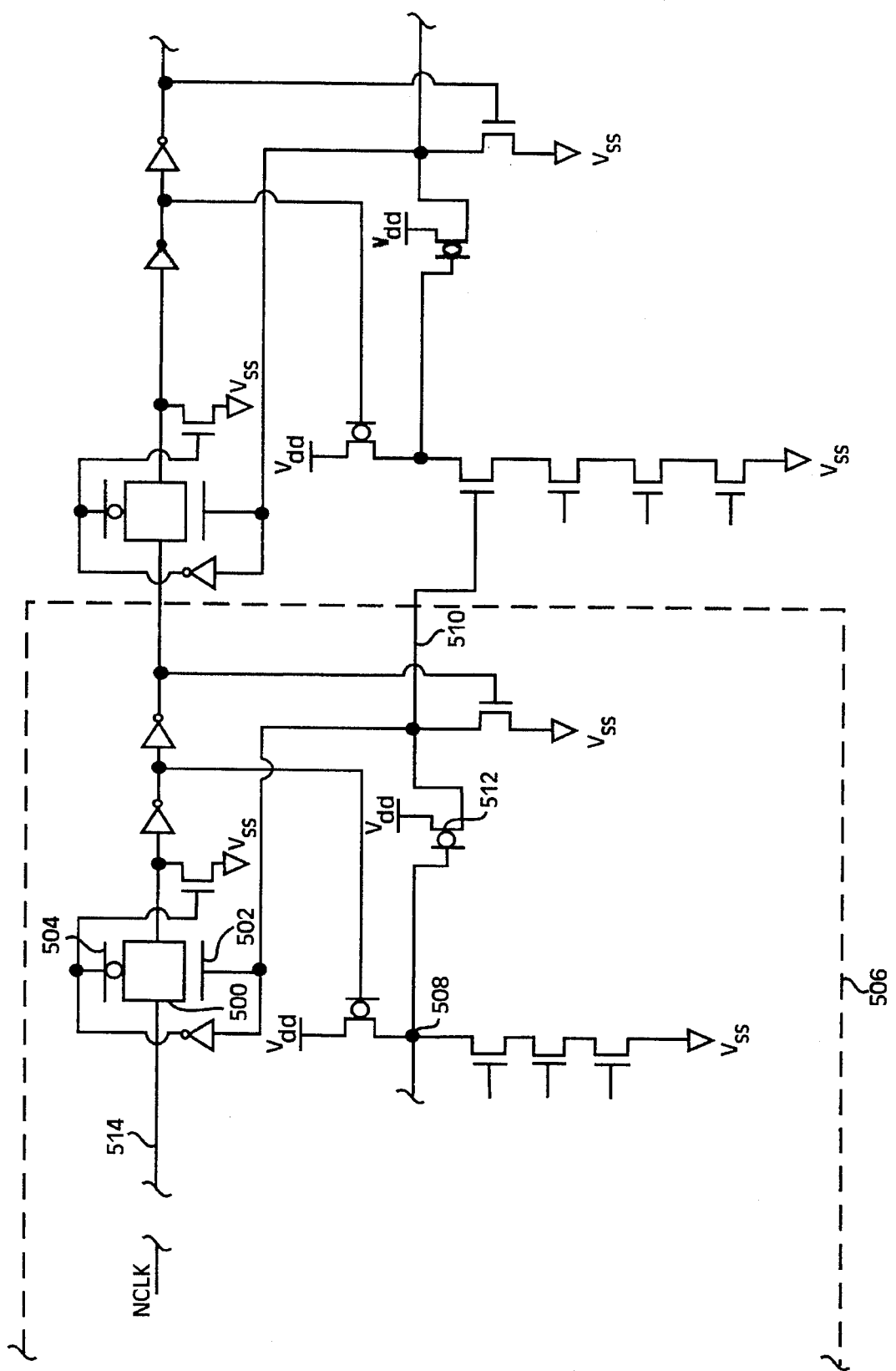
FIG. 8 shows in a simplified circuit diagram yet another embodiment of the wave propagation circuit, including a pass gate.

To further conserve power, output terminals of certain propagation circuit stages of the wave propagation circuit that do not switch during a given evaluation phase are not precharged in the next precharge phase. Referring to FIG. 8, there is shown a pass gate 500 comprising an n-channel device 502 and a p-channel device 504 associated with propagation circuit stage 506. To understand the operation of the circuit of FIG. 8, consider the situation when output terminal 508 of propagation circuit stage 506 switches from high to low during evaluation. Node 510 goes from low to high via p-channel device 512 of the dynamic inverter. When node 510 goes high, both n-channel device 502 and p-channel device 504 conducts, permitting NCLK clock 514 to propagate in the next precharge phase through pass gate 500 to precharge output terminal 508 as well as the output terminals of subsequent propagation circuit stages. Conversely, when output terminal 508 does not switch, i.e. stays at its precharged high, node 510 stays low. The low node 510 shuts off both n-channel device 502 and p-channel device 504. Since pass gate 500 is off, NCLK clock pulse 514 cannot traverse pass gate 500 to precharge output terminal 508 as well as the output terminals of subsequent propagation circuit stages in the next precharge phase, thereby conserving power.

Figure 9:
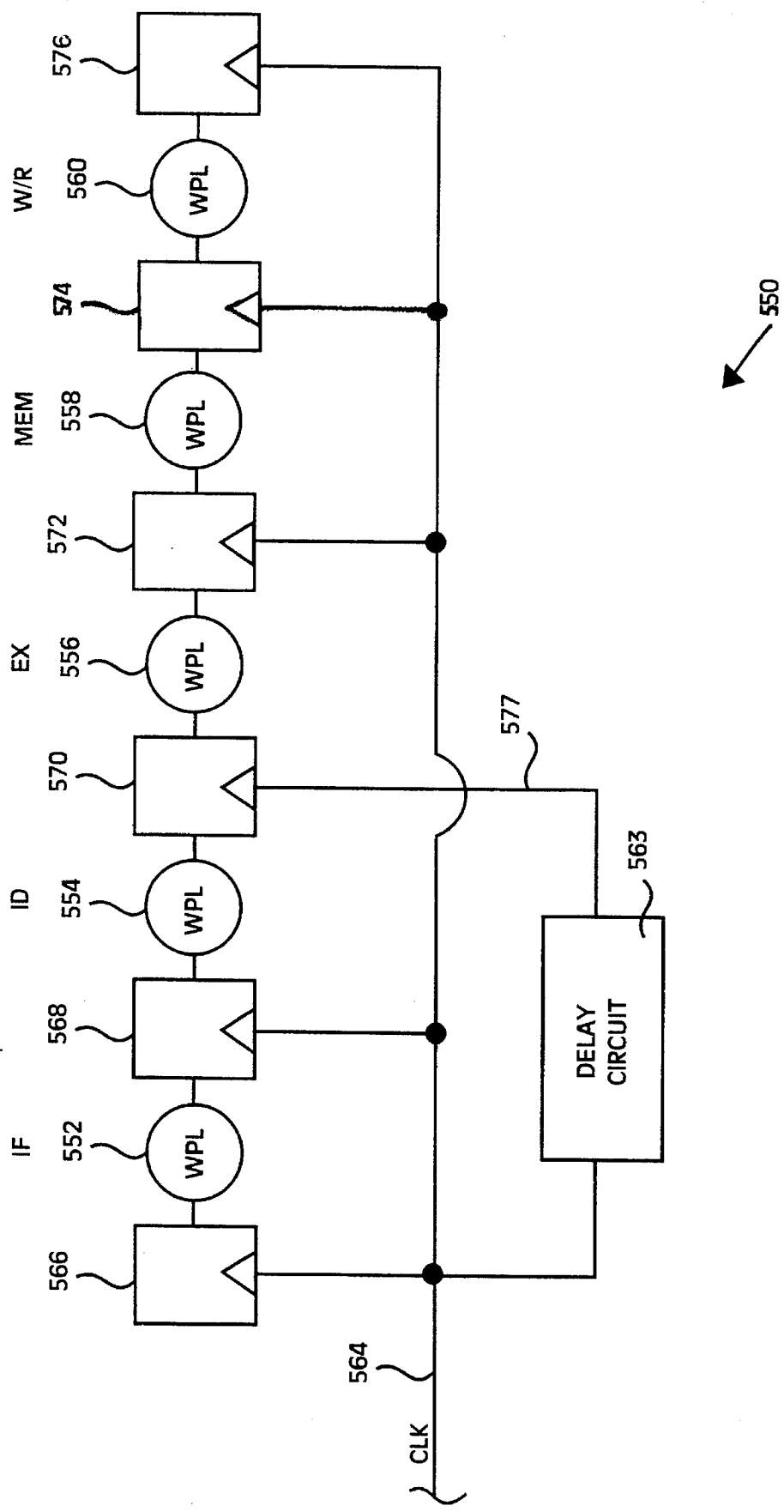
FIG. 9 shows in a simplified circuit diagram a microprocessor circuit utilizing the inventive wave propagation circuit to implement slack passing in accordance with another aspect of the present invention.

The wave propagation circuit of the invention advantageously permits slack passing. Referring to FIG. 9, there is shown a microprocessor circuit 550. Microprocessor circuit 550 may be used to implement the microprocessor pipeline stage, for example. A plurality of wave propagation logic circuits 552, 554, 556, 558, and 560 implement respective functions instruction fetch (IF), instruction decode (ID), execute (EX), memory operation (MEM), and write/read (WR). A plurality of flipflops 566, 568, 570, 572, 574, and 576 are shown coupled to the logic circuits to gate a clock signal into the respective logic circuits. In many microprocessors, instruction decode circuit 554 may require a longer period of time to complete its operation. Further, it is often the case that execution circuit 556 can complete its task in a relatively short time. Instead of slowing clock 564 to accommodate the slower decode circuit 554, slack passing permits decode circuit 554 to "borrow" some time from its neighbor to complete its operation.

Figure 10:
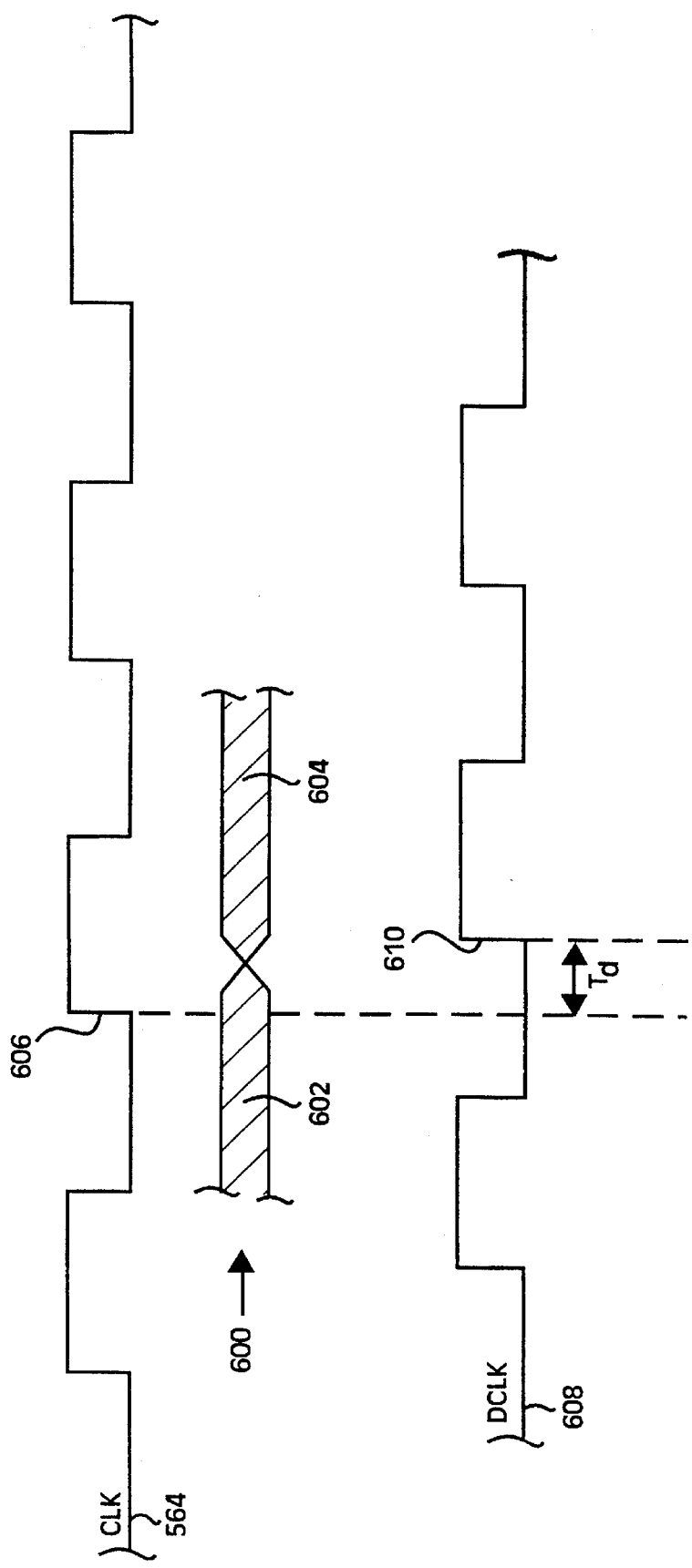
FIG. 10 shows a simplified timing diagram for the circuit of FIG. 9.

To accomplish slack passing in the circuit of FIG. 9, a delay circuit 563 is coupled in series between CLK clock 564 and a flip-flop 570 that gates the clock signal into execution circuit 556. Delay circuit 563 may be implemented using an even number of inverters or other delay techniques well known in the art. Referring to FIG. 10, there is shown a simplified timing diagram illustrating the effect of slack passing. CLK signal 564 is shown at the top. A data signal 600 having a data valid period 602 (for old data) and a data valid period 604 (for new data) is also shown. Data valid period 604 may, for example, represent the time during which data may be considered valid for data coming into latch 570 that feeds into execute circuit 556. Note that data valid period 604 arrives after the positive clock edge 606 of CLK clock 564. In other words, data arrives too late for execution circuit 556 to properly evaluate at positive clock edge 606.

Referring now to signal DCLK 608. In signal DCLK 608, original positive clock edge 606 has been delayed by a time Td sufficient to permit execution circuit 556 to properly evaluate at delayed positive edge 610. Note that by delaying only positive clock edge 606, it is not necessary to slow down the entire CLK clock 564. The delay merely means that execution circuit 556 begins its evaluation at a slightly later time. Since the clock frequency is otherwise unaffected, the circuit of FIGS. 9 and 10 advantageously operates at a higher clock frequency, thereby improving performance.

Figure 11:
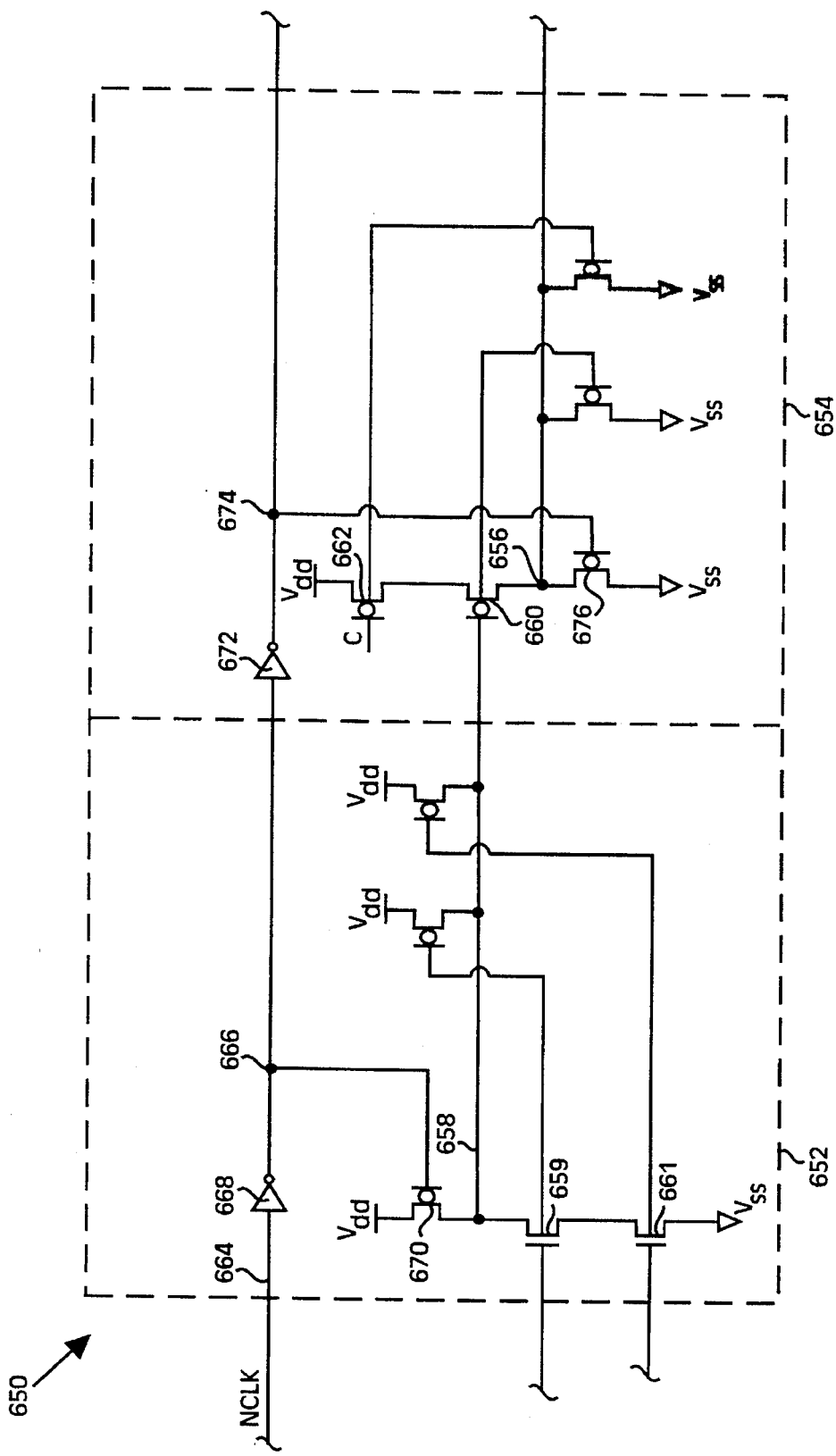
FIG. 11 shows in a simplified circuit diagram a wave propagation circuit including an n-channel based circuit stage and a p-channel based circuit stage according to yet another aspect of the present invention.

Further, it is possible to implement the wave propagation circuit of the present invention using circuit stages based on either p-channel evaluation devices or n-channel evaluation devices. Referring to FIG. 11, a wave propagation circuit 650 is shown. Wave propagation circuit 650 has an n-channel based circuit stage 652 cascaded with a p-channel based circuit stage 654. P-channel based circuit stage 654 is normally precharged low at its output terminal 656. When output terminal 658 of circuit stage 652 switches from high to low during evaluation due to a data pulse on n-channel evaluation device 659 (assuming the input to n-channel evaluation device 661 is high and active), p-channel evaluation device 660 of circuit stage 654 is turned on. Assuming that logic input C to p-channel evaluation device 662 is also low (active), a conductive path from output terminal 656 and Vdd exists, pulling output terminal 656 toward Vdd. When NCLK clock 664 goes high to precharge the circuit, node 666 goes low due to the action of inverter 668. The low node 666 turns on p-channel precharge device 670 and precharges output terminal 658 high. The same NCLK clock pulse propagates through inverter 672, driving node 674 high and turning on n-channel precharge device 676, thereby pulling output terminal 656 toward Vss. As is apparent, the circuit of FIG. 11 has all the timing and capacitive loading advantages of the inventive wave propagation logic as well as those associated with NORA logic.

It is further contemplated that the wave propagation circuits of the present invention could perform two evaluations per clock cycle. Double evaluations per clock cycle is possible in the present inventive circuit because the precharge and evaluation phases alternately propagate through the circuit stages in a serial, wavelike-manner.

Figure 12:
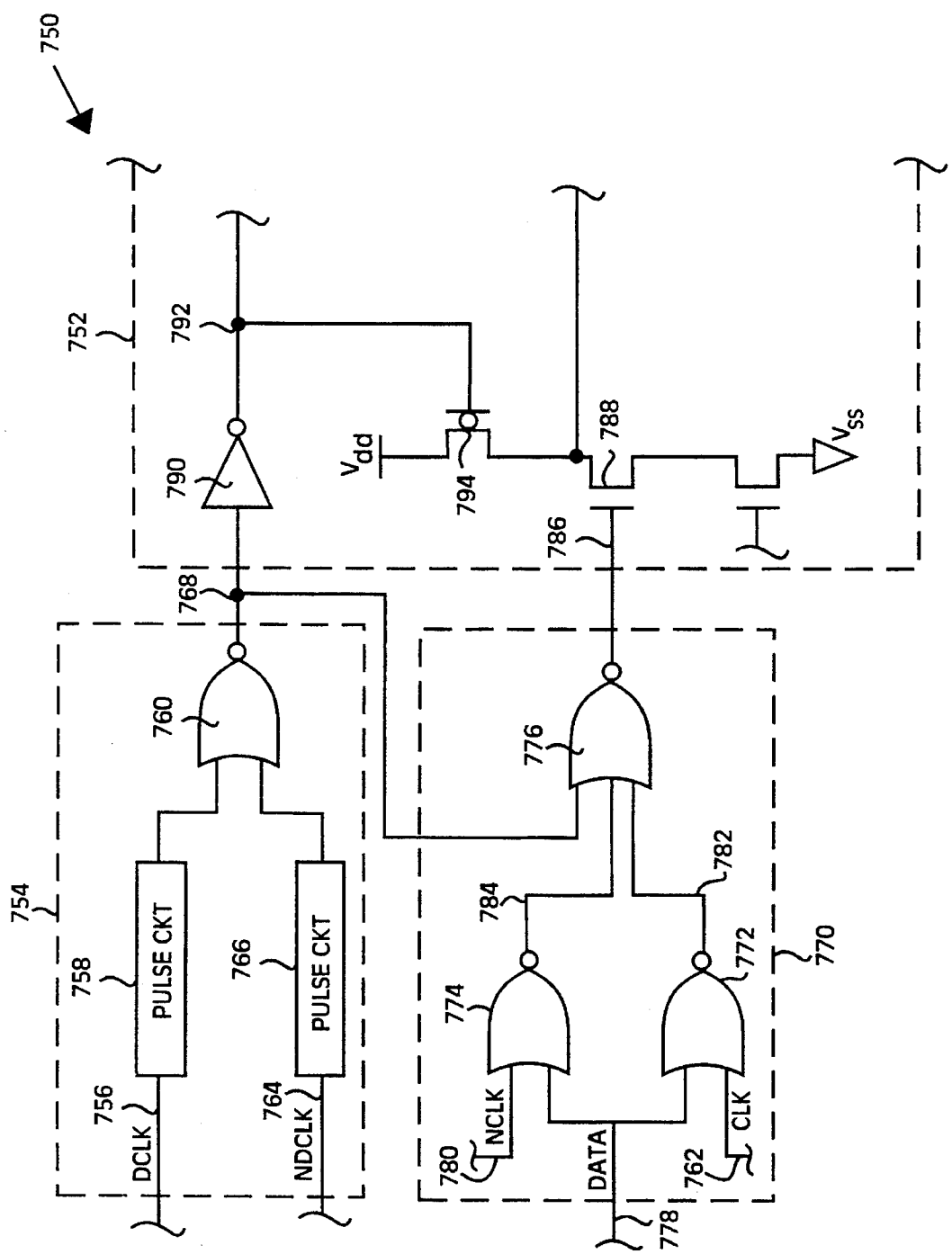
FIG. 12 shows in a simplified circuit diagram a wave propagation circuit for implementing multiple evaluations per clock cycle in accordance with yet another aspect of the present invention.

Referring to FIG. 12, a wave propagation circuit 750 for performing two evaluations per clock cycle is shown. In FIG. 12, a circuit stage 752 receives its precharge pulse on node 768 from a precharge pulse generation circuit 754. A first delay signal DCLK 756 is inputted into a pulse circuit 758, the output of which is inputted into an OR gate 760. Signal DCLK 756 represents a delayed, e.g. phase-shifted, version of signal CLK clock 762. Signal DCLK 756 may be derived from signal CLK clock 762 by, for example, a delay circuit comprising of an even number of inverter gates or any other conventional delay techniques. There is also shown a delay signal NDCLK 764, representing the complement of signal DCLK 756, inputted into another pulse circuit 766, the output of which is inputted into OR gate 760. Pulse circuits 758 and 766 may be, for example, similar to pulse circuit 301 of the circuit of FIG. 5. Alternatively, pulse circuits 758 and 766 may be implemented by any conventional techniques for generating a fixed pulse from a transition edge. As is apparent, OR gate 760 will output a pulse of a fixed duration at node 768 when either signal DCLK 756 or signal NDCLK 764 transitions from low to high. Since there are two such pulses during a clock cycle, there are two precharge pulses for precharging circuit stage 752 (and subsequent circuit stages) per clock cycle.

The pulsed data signal to circuit stage 752 is generated by a pulse generation circuit 770. In pulse generation circuit 770, there are shown two NOR gates 772 and 774 cascaded with a NOR gate 776. NOR gate 772 receives two input signals: a data signal 778 and a CLK clock signal 762. Similarly, NOR gate 774 receives two input signals: data signal 778 and a NCLK clock signal 780. NCLK clock signal 780 is the complement of CLK clock signal 762. When CLK clock signal 762 is high, NCLK clock signal 780 is low and vice versa. When CLK clock 762 is high (therefore NCLK clock 780 is low) and data signal 778 is high, both NOR outputs 782 and 784 are low. Absent a positive precharge pulse 768, NOR gate 776 switches node 786 high, turning on n-channel evaluation device 788 of circuit stage 752. When a precharge pulse caused by either delay signal DCLK 756 or NDCLK 764 appears on terminal 768, node 786 goes low due to NOR gate 776. As is apparent, pulse generation circuit 770 generates a positive data signal on node 786 if data 778 is high and either NCLK clock 780 or CLK clock 762 goes low. When the precharge pulse appears on node 768, that precharge pulse terminates the positive data signal, thereby generating a pulsed data signal on node 786. Note that since NCLK clock 780 goes high once during the clock cycle and CLK clock 762 goes high once, there could potentially be two pulsed data signal per clock cycle. Consequently, circuit stage 752 (and subsequent circuit stages) are evaluated and precharged twice per clock cycle.

Figure 13:
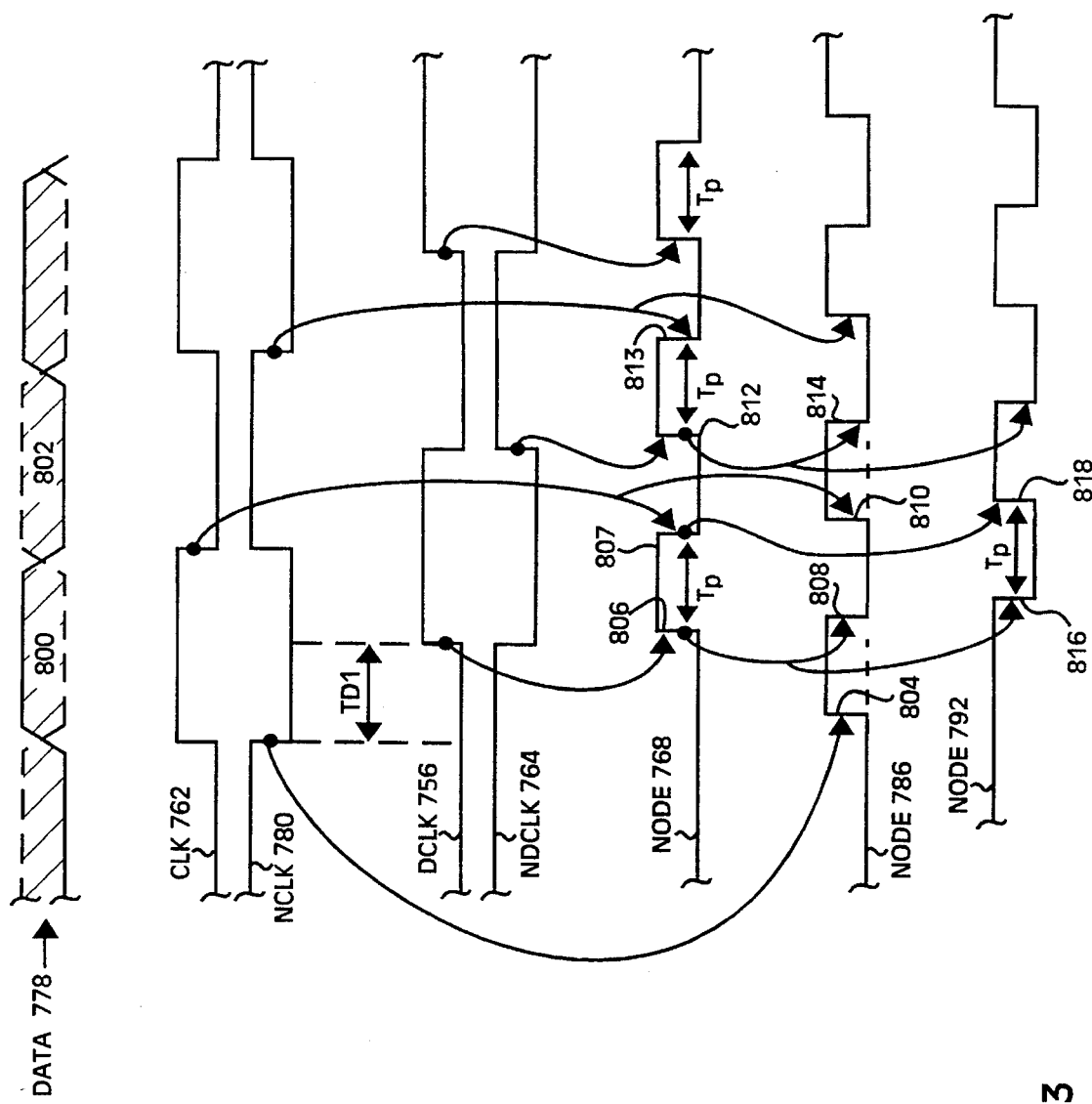
FIG. 13 shows a simplified timing diagram for the circuit of FIG. 12.

FIG. 13 shows in a simplified tinting diagram the timing traces at relevant nodes of the circuit of FIG. 12. There is shown in FIG. 13 data signal 778 which has two data cycles 800 and 802 per clock cycle of CLK clock 762. As discussed earlier, DCLK signal 756 and NDCLK signal 764 are delayed from CLK clock signal 762 and NCLK clock signal 780 by a fixed delay TD1. When either DCLK signal 756 or NDCLK signal 764 goes high, node 768 goes high. Node 768 represents the node on which a precharge pulse is presented to the wave propagation circuit of FIG. 12. After a fixed period Tp, node 768 goes low due to the operation of pulse circuit 754 of FIG. 12. Node 786 represents the node on which the pulsed data signal to circuit stage 752 of the wave propagation circuit of FIG. 12 is taken. Node 786 goes high when either CLK clock 762 or NCLK clock 780 is high and data signal 778 is high. For example, node 786 goes high at transition edge 804 when data signal 778 is in its data cycle 800. When node 768 goes high transition edge 806 due to the high DCLK clock 756, the high node 768 causes node 786 to go low at transition edge 808. Similarly, when data signal 778 is in its data cycle 802, node 786 goes high at transition edge 810. When node 768 goes high at transition edge 812, node 786 goes low at transition edge 814. As seen in FIG. 13, two pulsed data signals (804–808 and 810–814)

are available per clock cycle to evaluate data in data cycles 800 and 802 respectively. Similarly, two precharge pulses (806–807 and 812–813) are available to precharge the wave propagation circuit during a clock cycle.

In the circuit of FIG. 12, NOR gate 776 is preferably made faster than inverter 790. The faster NOR gate 776 permits the precharge pulse on node 768 (shown at transition edge 806 in FIG. 13) to turn off n-channel evaluation device 788 before p-channel precharge device 794 can be turned on. The effect of the faster NOR gate 776 is illustrated in FIG. 13. In FIG. 13, transition edge 806 on node 768 is used both to turn off the pulsed data signal on node 786 (at transition edge 808) and to pull node 792 low (at transition edge 816) to precharge the circuit of FIG. 12 via precharge device 794. The faster NOR gate 776 permits node 786 to go low at transition edge 808 prior to node 792 going low at transition edge 816. Consequently, n-channel evaluation device 788 of FIG. 12 is off before p-channel precharge device 794 turns on. The formation of an undesirable discharge path from Vdd to Vss via p-channel precharge device 794 and n-channel evaluation device 788 is thereby avoided.

Although the foregoing invention has been described in some detail for purposes of clarity of understanding, it will be apparent that certain changes and modifications may be practiced within the scope of the appended claims. For instance, although the specification has described a wave propagation circuit employing dynamic inverters for buffering data signals coming into and going out of each propagation circuit stage, static inverters can be used as well. For clarity, some circuits are described without the inventive power saving circuit. Nevertheless, it is within the abilities of those of ordinary skills in the art to adapt the disclosed power saving circuit to operate with the wave propagation circuits that do not expressly contain the disclosed power saving circuit. As a further example, the forward conducting devices and feedback devices described herein can be adapted to work with any of the wave propagation circuits described herein, with or without the power saving circuits. Given this disclosure, it will be apparent to those of ordinary skills in the art that combinations and substitutions may be made without departing from the scope and the spirit of the present invention. Further, although the inventive techniques and circuits have been described herein with reference to wave propagation circuits, it should be appreciated that the invention is not so limited and may be employed in many different types of CMOS circuits. For example, the power saving circuits and the circuits utilized to improve the noise margin and to reduce output errors caused by charge sharing and charge leakage may be adapted to work with other types of dynamic logic such as domino logic. Consequently, the scope of the invention is not limited to the specific examples given herein but is set forth in the appended claims.

What is claimed is:

1. A circuit, comprising:

a first clock terminal; and a first circuit stage for evaluating a first plurality of logic inputs, comprising, a pulse generation circuit coupled to said first clock terminal, an output terminal, an evaluation device coupled to said output terminal and said pulse generation circuit, said evaluation device being part of a first circuit stage evaluation device chain coupled in series between said output terminal and a second logic level, said first circuit stage evaluation device chain having as many evaluation devices as the number of logic inputs in said first plurality of logic inputs, and a precharge device coupled to said output terminal and a first logic level.

2. The circuit of claim 1 further comprising:

a second circuit stage, comprising, a second stage output terminal, a second stage precharge device coupled between said second stage output terminal and said first logic level, and a plurality of second stage evaluation devices, one of said plurality of second stage evaluation devices coupled to said second stage output terminal, another one of said plurality of second stage evaluation devices coupled to said second logic level, the number of evaluation devices in said plurality of second stage evaluation devices equals the number of logic inputs into said second circuit stage; and a buffer circuit coupled between said output terminal of said first circuit stage and one of said plurality of second stage evaluation devices.

3. The circuit of claim 1 further comprising:

a second circuit stage coupled to the output terminal of said first circuit stage, comprising, a second stage output terminal, a second stage precharge device coupled between said second stage output terminal and said second logic level, and a plurality of second stage evaluation devices, one of said plurality of second stage evaluation devices coupled to said second stage output terminal, another one of said plurality of second stage evaluation devices coupled to said first logic level, the number of evaluation devices in said plurality of second stage evaluation devices equals the number of logic inputs into said second circuit stage.

4. The circuit of claim 1 wherein said pulse generation circuit comprises:

a NOR gate having a first NOR input coupled to a data terminal, a second NOR input coupled to said first clock terminal, and a NOR output coupled to said evaluation device.

5. A circuit, comprising:

a first clock terminal; and a first circuit stage, comprising, a pulse generation circuit coupled to said first clock terminal, an output terminal, an evaluation device coupled to said output terminal and said pulse generation circuit, and a precharge device coupled to said output terminal and a first logic level, wherein said pulse generation circuit comprises a first inverter having an inverter output coupled to said evaluation device, and a NAND gate having a first NAND input coupled to a data terminal, a second NAND input coupled to said first clock terminal, and a NAND output coupled to an input of said first inverter.

6. The circuit of claim 5 wherein said first inverter further comprises:

a first p-channel device coupled to said first logic level, said evaluation device, and said NAND output;

a second clock terminal; and a first n-channel device coupled to said first p-channel device, said evaluation device, said second clock terminal, and a second logic level.

7. The circuit of claim 6 wherein said first stage further comprising a second inverter having a second inverter input and a second inverter output, said second inverter input being coupled with said second clock terminal, said second inverter output being coupled to a control terminal of said precharge device.

8. The circuit of claim 7 further comprising a second circuit stage, said second circuit stage comprising:

a second stage output terminal, a second stage evaluation device coupled to said second stage output terminal, and a second stage precharge device coupled to said second stage output terminal and said first logic level; and a third inverter coupled in series between said output terminal of said first circuit stage and said second stage evaluation device.

9. The circuit of claim 8 wherein said pulse generation circuit generates a data pulse responsive to an evaluation cycle of said first clock terminal.

10. The circuit of claim 9 wherein said second stage precharge device precharges said second stage output terminal responsive to a delayed precharge pulse, said delayed precharge pulse being a delayed version of a precharge pulse from said second inverter.

11. The circuit of claim 6 wherein said first circuit stage further comprising:

a delay circuit having a delay output and a delay input, said delay input being coupled to said first clock terminal;

a second inverter having a second inverter output and a second inverter input, said second inverter input being coupled to said delay output; and a NOR gate having a first NOR input coupled to said first clock terminal, a second NOR input coupled to said second inverter output, and a NOR output coupled to said first n-channel device.

12. The circuit of claim 6 wherein said first circuit stage further comprising:

a forward conduction device coupled to said output terminal, said first logic level, and said evaluation device.

13. The circuit of claim 6 wherein said first circuit stage further comprising:

a feedback device coupled to said evaluation device, said first p-channel device, said first n-channel device, and said output terminal.

14. The circuit of claim 6 wherein said first circuit stage further comprising a precharge inhibiting circuit coupled to said precharge device.

15. The circuit of claim 14 wherein said precharge inhibiting circuit comprises:

a first node;

a second p-channel device coupled to said first node, said first logic level, and said output terminal of said first circuit stage;

a second inverter having a second inverter input and a second inverter output, said second inverter output being coupled to said precharge device; and a pass gate coupled to said second inverter input, said first node, and said second clock terminal.

16. A method for improving performance in a circuit, comprising:

providing a first clock terminal;

providing a first circuit stage, comprising,
coupling a pulse generation circuit to said first clock terminal,
providing an output terminal,
coupling a first stage evaluation device to said output terminal and said pulse generation circuit, said first stage evaluation device being part of a first circuit stage evaluation device chain coupled in series between said output terminal and a second logic state, said first stage evaluation device chain having as many evaluation devices as the number of logic inputs into said first circuit stage, and
coupling a first stage precharge device to said output terminal and a first logic level.

17. The method of claim 16 wherein said step of providing said pulse generation circuit comprises:

providing a first inverter;

coupling an output terminal of said first inverter to said first stage evaluation device;

providing a NAND gate; and coupling a first NAND input of said NAND gate to a data terminal, a second NAND input of said NAND gate to said first clock terminal, and a NAND output of said NAND gate to an input of said first inverter.

18. The method of claim 17 wherein said step of providing said first inverter further comprises:

providing a first p-channel device;

coupling said first p-channel device to said first logic level, said first stage evaluation device, and said NAND output;

providing a second clock terminal and a first n-channel device; and coupling said first n-channel device to said first p-channel device, said first stage evaluation device, said second clock terminal, and a second logic level.

19. The method of claim 18 further comprising the step of providing a second circuit stage, comprising:

providing a second stage output terminal;

coupling a second stage evaluation device to said second stage output terminal;

coupling a second inverter in series between said output terminal of said first circuit stage and said second stage evaluation device; and coupling a second stage precharge device to said second stage output terminal and said first logic level.

20. The method of claim 19 further comprising the step of providing a plurality of evaluation devices, a first one of said plurality of evaluation devices coupled to said second logic level and a second one of said plurality of evaluation devices coupled to said first stage evaluation device.

21. The method of claim 20 wherein the sum of said plurality of evaluation devices and said first stage evaluation device equals the number of logic inputs into said first circuit stage.

22. A circuit, comprising:

a first circuit stage for evaluating a first output from a first plurality of logic inputs, comprising,
a first output terminal, a first precharge device coupled to said first output terminal for precharging said first output terminal to a first logic state with a first precharge pulse, a first set of evaluation devices coupled in series between said first output terminal and a second logic state for pulling said first output terminal to said second logic state, said first set of evaluation devices having the same number of evaluation devices as the number of logic inputs in said first plurality of logic inputs; and a pulse generation circuit coupled to one of said first set of evaluation devices for providing a pulsed data signal to said one of said first set of evaluation devices.

23. The circuit of claim 22, further comprising:

an inverter having an inverter input and an inverter output, said inverter input being coupled to said first output terminal; and a second circuit stage for evaluating a second output from a second plurality of logic inputs, one of said second plurality of logic inputs being coupled to said inverter output, comprising, a second output terminal, a second precharge device coupled to said second output terminal for precharging said second output terminal to said first logic state with a second precharge pulse, said second precharge pulse being said first precharge pulse propagated through said first circuit stage, and a second set of evaluation devices coupled to said second output terminal for pulling said second output terminal to said second logic state, said second set of evaluation devices having the same number of evaluation devices in said second set of evaluation devices as the number of inputs in said second plurality of inputs.

* * * * *